United States Patent
Shields et al.

(10) Patent No.: US 6,794,298 B2
(45) Date of Patent: Sep. 21, 2004

(54) $CF_4+H_2O$ PLASMA ASHING FOR REDUCTION OF CONTACT/VIA RESISTANCE

(75) Inventors: Jeffrey A. Shields, Sunnyvale, CA (US); Lu You, Santa Clara, CA (US); Mohammad R. Rakhshandehroo, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 302 days.

(21) Appl. No.: 09/498,336

(22) Filed: Feb. 4, 2000

(65) Prior Publication Data

US 2001/0036740 A1 Nov. 1, 2001

(51) Int. Cl.⁷ .............................. H01L 21/20
(52) U.S. Cl. .............. 438/710; 438/689; 438/709; 438/711; 438/712; 438/713; 438/714
(58) Field of Search .................. 438/710, 689, 438/709, 711, 712, 713, 714

(56) References Cited

U.S. PATENT DOCUMENTS

| | | | |
|---|---|---|---|
| 5,814,155 A | 9/1998 | Solis et al. ............. | 134/1 |
| 5,851,302 A | 12/1998 | Solis ..................... | 134/1.2 |
| 6,030,891 A * | 2/2000 | Tran et al. ............. | 438/623 |
| 6,046,104 A * | 4/2000 | Kepler .................. | 438/637 |
| 6,093,635 A * | 7/2000 | Tran et al. ............. | 438/623 |
| 6,133,143 A * | 10/2000 | Lin et al. ............... | 438/627 |
| 6,235,453 B1 * | 5/2001 | You et al. .............. | 430/329 |

OTHER PUBLICATIONS

1997 IEEE International Symposium on Semiconducto5r Manufacturing Conference Proceedings.

* cited by examiner

*Primary Examiner*—Robert Kunemund

(57) ABSTRACT

The degradation of deposited low dielectric constant interlayer dielectrics and gap fill layers, such as HSQ layers, during formation of contacts/vias is significantly reduced or prevented by employing a plasma containing $CF_4+H_2O$ to remove the photoresist mask and cleaning the contact/via opening after anisotropic etching. The $CF_4+H_2O$ plasma also enables rapid photoresist stripping at a rate of about 10 to about 20 KÅ/min. Embodiments include photoresist stripping and cleaning the contact/via opening with a $CF_4+H_2O$ plasma to prevent reduction of the number of Si—H bonds of an as-deposited HSQ layer below about 70%.

18 Claims, 3 Drawing Sheets

CF₄+H₂O PLASMA ASHING FOR REDUCTION OF CONTACT/VIA RESISTANCE

RELATED APPLICATION

This application contains subject matter similar to subject matter disclosed in U.S. patent application Ser. No. 09/498,335 filed on Feb. 4, 2000.

TECHNICAL FIELD

The present invention relates to high density, multi-metal layer semiconductor device with reliable interconnection patterns. The present invention has particular applicability in manufacturing ultra large scale integration multi-metal layer semiconductor devices with a design rule of about 0.15 micron and under, e.g., about 0.12 micron and under.

BACKGROUND ART

The escalating demands for high density and performance associated with ultra large scale integration semiconductor devices require a design rule of about 0.15 micron and under, such as about 0.12 micron and under, increased transistor and circuit speeds, high reliability and increased manufacturing throughput. The reduction of design rules to about 0.15 micron and under challenges the limitations of conventional interconnection technology, including conventional photolithographic, etching and deposition techniques.

Conventional semiconductor devices typically comprise a semiconductor substrate, typically doped monocrystalline silicon, and a plurality of sequentially formed inter-layer dielectrics and patterned metal layers. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink into the deep submicron range.

A conductive plug filling a via opening is typically formed by depositing an inter-layer dielectric on a patterned conductive (metal) layer comprising at least one metal feature, forming an opening in the inter-layer dielectric by conventional photolithographic and etching techniques, and filling the opening with a conductive material, such as tungsten (W). Excess conductive material on the surface of the inter-layer dielectric is removed by chemical-mechanical polishing (CMP). One such method is known as damascene and basically involves the formation of an opening which is filled in with a metal. Dual damascene techniques involve the formation of an opening comprising a lower contact or via opening section in communication with an upper trench opening section, which opening is filled with a conductive material, typically a metal, to simultaneously form a conductive plug in electrical contact with a conductive line.

The conventional practice of forming a landing pad completely enclosing the bottom surface of a contact or via utilizes a significant amount of precious real estate on a semiconductor ship which is antithetic to escalating demands for high density. In addition, it is extremely difficult to voidlessly fill through-holes having such reduced dimensions because of the extremely high aspect ratio, i.e., height/width of the through-hole opening. Accordingly, conventional remedial techniques comprise purposely widening the diameter of the through-hole to decrease the aspect ratio. As a result, misalignment occurs wherein the bottom surface of the conductive via is not completely enclosed by the underlying metal feature. This type of via is called a "borderless via", which also conserves chip real estate.

High performance microprocessor applications require rapid speed of semiconductor circuitry. The speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the resistance capacitance (RC) delay caused by the interconnect wiring increases. If the interconnection node is routed over a considerable distance, e.g., hundreds of microns or more, as in submicron technologies, the interconnection capacitance limits the circuit node capacitance loading and, hence, the circuit speed. As design rules are reduced to about 0.15 micron and below, the rejection rate due to integrated circuit speed delays severely limits production throughput and significantly increases manufacturing costs. Moreover, as line widths decrease, electrical conductivity and electromigration resistance become increasingly important.

As device geometries shrink and functional density increases, it becomes increasingly imperative to reduce the capacitance between metal lines. Line-to-line capacitance can build up to a point where delay time and cross talk may hinder device performance. Reducing the capacitance within multi-level metallization systems will reduce the RC constant, cross talk voltage, and power dissipation between the lines.

One way to increase the speed of semiconductor circuitry is to reduce the resistance of a conductive pattern. Conventional metallization patterns are typically formed by depositing a layer of conductive material, notable aluminum or an alloy thereof, and etching, or by damascene techniques where trenches are formed in dielectric layers and filled with conductive material. The use of metals having a lower resistivity than aluminum, such as copper, engenders various problems which limit their utility. For example, copper readily diffuses through silicon dioxide, the typical dielectric material employed in the manufacture of semiconductor devices, and adversely affects the devices. In addition, copper does not form a passivation film, as does aluminum. Hence, a separate passivation layer is required to protect copper from corrosion.

The dielectric constant of materials currently employed in the manufacture of semiconductor devices for an inter-layer dielectric (ILD) spans from about 3.5 for dense silicon dioxide to over 8 for deposited silicon nitride and spin-on glass. Prior attempts have been made to reduce the interconnect capacitance and, hence, increase the integrated circuit speed, by developing dielectric materials having a lower dielectric constant than that of silicon dioxide. New materials having low dielectric constants, such as low dielectric constant polymers, e.g., methyl silsesquioxane (MSQ) and hydrogen silsesquioxane (HSQ), teflon, aerogels and porous polymers have been developed. There has been some use of certain polyimide materials for ILDs which have a dielectric constant slightly below 3.0.

Low dielectric constant (low-k) polymers, such as HSQ, offer many advantages for use in interconnect patterns. HSQ is relatively carbon free, thereby avoiding poison via problems. Moreover, due to the virtual absence of carbon, it is not necessary to etch back HSQ below the upper surface of the metal lines to avoid shorting. In addition, HSQ exhibits excellent planarity and is capable of gap filling interwiring spacings less than 0.15 microns employing conventional spin-on equipment. HSQ undergoes a melting phase at approximately 200° C., but does not convert to the high dielectric constant glass phase until reaching temperatures of about 400° C. for intermetal applications and about 700° C. to about 800° C. for premetal applications.

However, low-k polymers, such as MSQ and HSQ, are susceptible to degradation during processing leading to various problems, such as voids, particularly when used as gap fill layers or ILDs during contact or via formations, particularly when forming borderless vias. For example, when forming a conventional contact or via a through-hole is etched through an ILD, e.g., HSQ, exposing surfaces forming the through-hole. When forming a borderless via, a photoresist mask is deposited and the misaligned through-hole etched to expose a portion of an upper surface and a portion of a side surface of a metal line, and penetrate into and expose the gap fill layer. The photoresist mask is then stripped, typically employing an oxygen ($O_2$)-containing plasma. Subsequently, solvent cleaning is performed to remove polymeric residues in the through-hole. It was found that the $O_2$-containing plasma employed to strip the photoresist mask and solvent cleaning of the through-hole degrade low-k materials, such as HSQ, employed for ILDs and for gap fill layers when forming contacts and vias. In stripping a photoresist mask after forming a conventional contact or via opening and solvent cleaning the through-hole, the low-k ILD is found to be degraded manifested by an increase in the dielectric constant of the low-k dielectric material. In addition, when employing a low-k dielectric material as a gap fill layer in forming a borderless via, upon subsequent filling of the misaligned through-hole, as with a barrier material, such as titanium nitride or titanium—titanium nitride, spiking occurs, i.e., the barrier material penetrates through the HSQ gap fill layer to the substrate or underlying conductive feature.

The precise mechanism involved in degrading low-k materials upon $O_2$-plasma stripping of a photoresist mask and solvent cleaning the through-hole after anisotropic etching to form a contact or via opening is not known with certainty, but would depend, in part, upon the particular low-k dielectric material employed for the ILD and/or gap fill layer. Various silsesquioxanes are particularly affected by $O_2$-plasmas. For example, HSQ typically contains between about 70% and about 90% Si—H bonds. However, upon exposure to an $O_2$-containing plasma, a considerable number of Si—H bonds are broken and Si—OH bonds are formed. Upon treatment with an $O_2$-containing plasma, as much as about 20% to about 30% of the Si—H bonds in the deposited HSQ film remained. In addition, it was found that exposure to an $O_2$-containing plasma increased the moisture content of the as deposited HSQ film and its propensity to absorb moisture. An HSQ film having reduced Si-H bonds and high Si—OH bonds tends to absorb moisture from the ambient, which moisture outgasses during subsequent barrier metal deposition. Thus, it was found that during subsequent barrier and metal deposition, e.g., titanium—titanium nitride and tungsten, outgassing occurred thereby creating voids leading to incomplete electrical connection.

Solis, et al. in "Novel $CF_4+H_2O$ Ashing Process for Reduction of Via Resistance", ISSM Proceedings, 1997, pages F-25 through F-27, disclose the use of ashing chemistry incorporating $H_2O$ and $CF_4$ for improved polymer stripability and reduced via resistance. Solis, in U.S. Pat. No. 5,851,302, discloses the use of a plasma containing $CF_4$ and $H_2O$ for stripping sidewall polymer from etched via holes and from etched metal lines. Solis et al., in U.S. Pat. No. 5,814,155, disclose the use of a plasma containing $O_2$, $CF_4$ and $H_2O$ for ashing to selectively remove sidewall polymer formation from etched metal lines.

In U.S. patent application Ser. No. 08/933,430, filed on Dec. 18, 1997, a method is disclosed for selectively heating portions of a deposited HSQ layer adjoining a metal feature to increase the resistance of such adjoining portions to penetration when etching a misaligned through-hole for a borderless via. In U.S. patent application Ser. No. 08/933,125, filed on Dec. 18, 1997, a method is disclosed for preventing the degradation of deposited HSQ layers during formation of a borderless via comprising stripping the photoresist mask employing a hydrogen-containing stripping plasma to prevent reduction in the number of Si—H bonds of the deposited HSQ gap filled layer below about 70%.

In view of the manifest advantages attendant upon employing low-k materials, such as HSQ, in interconnection systems, as for ILDs and gap fill layers, there exists a need to provide efficient methodology enabling such use of low-k materials without degradation.

DISCLOSURE OF THE INVENTION

An advantage of the present invention is a method of manufacturing a high density multi-metal layer semiconductor device with a design rule of about 0.15 micron and under, and an interconnection pattern comprising high integrity contact/vias and low-k materials without degradation.

Another advantage of the present invention is a method of forming interconnection patterns employing low-k materials for ILDs and/or gap fill layers without degradation upon forming contact/vias.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a first dielectric layer on a substrate; forming a first patterned conductive layer having gaps on the first dielectric layer, the first patterned conductive layer comprising a first conductive feature having an upper surface and side surfaces; depositing a dielectric gap fill layer to fill the gaps; depositing a second dielectric layer on the first patterned conductive layer and on the gap fill layer; forming a photoresist mask on the second dielectric layer; forming a through-hole in the second dielectric layer exposing the upper surface of the first conductive feature; and removing the photoresist mask and cleaning the through-hole with a plasma containing carbon tetrafluoride ($CF_4$) and water vapor ($H_2O$); wherein, the gap fill layer and/or second dielectric layer have an as-deposited dielectric constant no greater than about 3.

Another advantage of the present invention is a method of manufacturing a semiconductor device, the method comprising: depositing a layer of dielectric material, having an as-deposited dielectric constant no greater than about 3, over a conductive region or conductive feature; forming a through-hole in the dielectric layer exposing the upper surface of the conductive region or conductive feature; and removing the photoresist mask and cleaning the through-hole with a plasma containing $CF_4$ and $H_2O$.

Embodiments of the present invention include the use of a low-k dielectric material, e.g., a dielectric material having a dielectric constant of about 1.8 to about 3.0, as an ILD and/or gap fill layer, and removing the photoresist mask employing a plasma at a removal rate of about 10,000 to about 20,000 Å/min such that the dielectric constant of the low-k material does not increase more than about 10%. Embodiments of the present invention comprise employing a silsesquioxane, such as HSQ, as an ILD and/or gap fill layer and removing the photoresist mask with a plasma containing $CF_4$ and $H_2O$ at a rate of about 10,000 to about 20,000 Å/min such that the number of Si—H bonds in the HSQ layer is not reduced below about 70% of the number of Si—H bonds in the as-deposited HSQ layer. Advantageously, the use of a plasma containing both $CF_4$ and $H_2O$ enables rapid photoresist removal and rapid removal of polymeric residues from the through-hole without degrading low-k materials.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
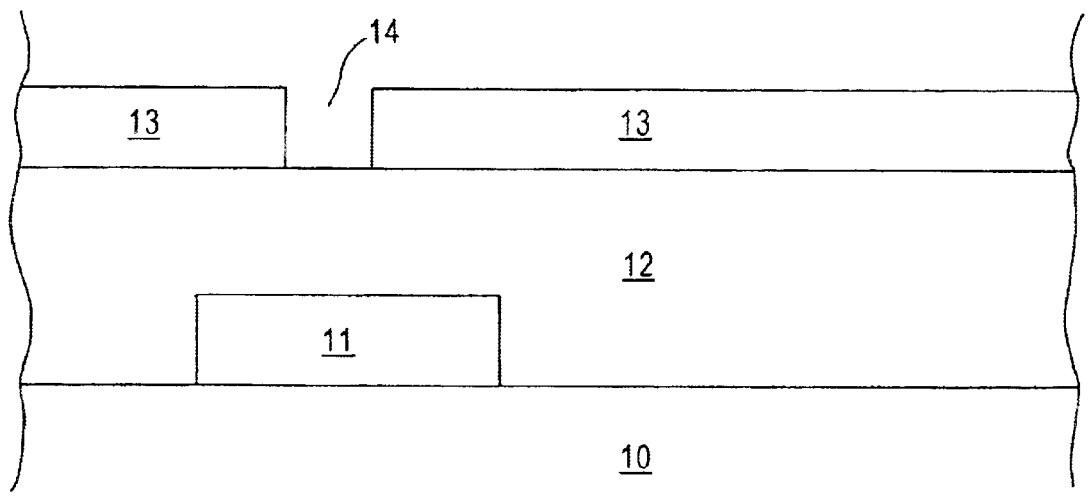
FIGS. 1 through 4 schematically illustrate sequential phases of a method in accordance with an embodiment of the present invention.

The relentless pursuit of increased miniaturization and its attendant increase in interconnects having small contacts and small cross-sections mandates a reduction in the capacitance between metal aligns. Hence, it becomes imperative to employ low-k materials, e.g., materials having a dielectric constant less than about 3, e.g., about 1.8 up to about 3, for ILDs and gap fill layers for interconnection patterns without degradation, as by suffering an undesirable increase in their dielectric constants, when forming a contact/via opening. Conventional practices comprise forming such contact/via openings by anisotropic etching employing a photoresist mask and subsequently removing the photoresist mask employing an oxygen-containing plasma and solvent cleaning the openings to remove polymeric residues, thereby degrading low-k materials, such as HSQ by reducing the number of Si—H bonds and increasing the number of Si—OH bonds with respect to the as-deposited HSQ layer, rendering it prone to absorb moisture from the ambient. In U.S. patent application Ser. No. 08/933,125, filed on Dec. 18, 1997, such adverse consequences are avoided by removing the photoresist mask employing a plasma containing a sufficient amount of hydrogen, such as a forming gas of hydrogen and nitrogen, to prevent reduction in the amount of Si—H bonds of the as-deposited HSQ gap fill layer to below about 70%. It was found, however, that such a technique, while effective in minimizing degradation of HSQ during photoresist mask stripping, is an extremely slow process with an extremely low photoresist strip rate, thereby adversely impacting manufacturing throughput.

The present invention addresses and solves the problem of low-k ILD and/or gap fill layer degradation due to photoresist mask stripping and solvent cleaning the through-hole by enabling the photoresist mask to be removed at a rapid rate, and further rapidly removing polymeric residues from the through-hole, without degrading the low-k material. In accordance with the embodiments of the present invention, a plasma containing $CF_4$ and $H_2O$ is employed for photoresist mask removal and solvent cleaning the through-hole. The water vapor component of the plasma comprises mainly $H^+$ and $OH^-$ components, which do not degrade low-k materials, such as HSQ, as does an $O_2$ plasma. The $CF_4$ component enhances photoresist removal and enables rapid removal of polymeric residues from the through-hole. Advantageously, the use of a plasma containing $CF_4$ and $H_2O$ to remove the photoresist mask after etching a contact/via opening enables a photoresist strip rate of about 10,000 to about 20,000 Å/min., depending upon the particular tool employed. Such a high photoresist strip rate enables removal of the photoresist mask in a relatively short period of time, such as about 20 seconds to about 60 seconds, e.g., about 20 to about 40 seconds, thereby reducing the amount of time the low-k material is exposed to the plasma. Given the present disclosure and guidance, the optimum parameters in a particular situation can be easily determined to maximize the photoresist strip rate and removal of polymeric residues from the through-hole. For example, generally, as the temperature, power and gas flow increases, the photoresist and polymeric residue removal rate increase. The pressure can be increased or decreased to increase the photoresist and polymeric residue removal rate, depending upon the particular situation and tool employed.

It was found that a plasma containing $CF_4$ and $H_2O$ can be employed for photoresist mask and polymeric residue removal without causing an increase in the as-deposited low-k material greater than about 15%, and even not greater than about 10%. When employing HSQ, the use of a plasma containing $CF_4$ and $H_2O$ prevents a significant reduction in the number of Si—H bonds, such that the number of Si—H bonds, subsequent to photoresist mask and polymeric residue removal, is no less than about 60% to about 80%, e.g., no less than about 70%, of the number of Si—H bonds in the as-deposited HSQ layer. It was found that the use of a plasma containing $CF_4$ and $H_2O$ enables significant retention of the low-k properties of HSQ. For example, subsequent to removal of the photoresist mask and polymeric residues from the through-hole, HSQ layers exhibit a dielectric constant of about 3.1 to about 3.3 as compared to the as-deposited value of about 2.9 to about 3.0.

The present invention is applicable to the use of any of various low-k materials, such as aerogels, polymers, such as polyimides, and carbon-containing silicon dioxide, such as Black Diamond™ available from Applied Materials, Inc. of Santa Clara, Calif. The present invention has particular applicability in the use of various silsesquioxanes, such as HSQ and MSQ. The present invention advantageously enables the use of various low-k dielectric materials, such as HSQ, as ILDs and gap fill layers with little or no degradation of the as-deposited low-k material without adversely impacting production throughput, by enabling rapid removal of the photoresist mask and polymeric residues from the through-hole.

Subsequent to forming the contact/via opening or through-hole, the interconnection is completed in a conventional manner as by depositing a conductive material, such as tungsten or copper, with an appropriate initial barrier layer, such as tantalum or tantalum nitride. The present invention enjoys applicability in forming contacts establishing electrical connection with an active region on a semiconductor substrate, such as a source/drain region, as well as vias establishing electric contact between different metallization levels, including borderless vias.

Figure 2:
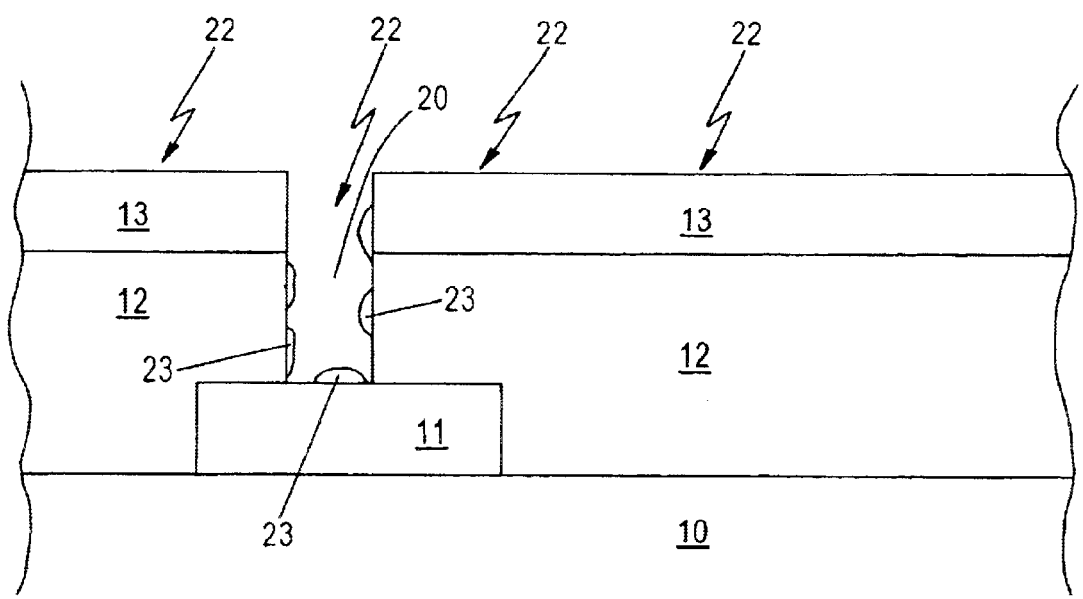
Figure 3:
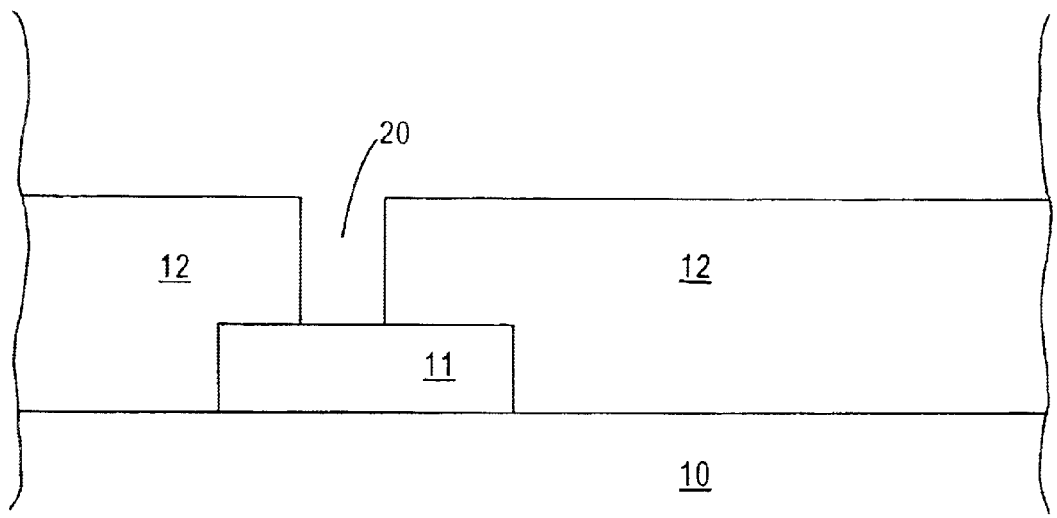
Figure 4:
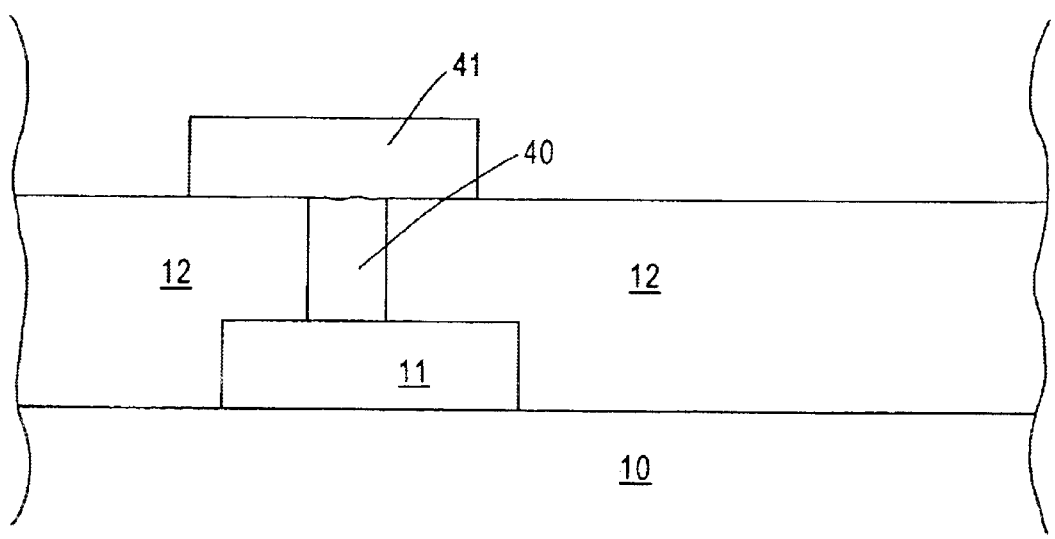

An embodiment of the present invention is schematically illustrated in FIGS. 1 through 4, wherein similar features are denoted by similar reference numerals. Adverting to FIG. 1, a conductive feature 11 is formed on dielectric layer 10. ILD 12, e.g., HSQ, is deposited and planarized, as by CMP. A photoresist mask 13 having an opening 14 is formed on ILD 12. As shown in FIG. 2, anisotropic etching is conducted to form via opening 20 in ILD 12 containing polymeric residues 23. Photoresist mask 13 and via opening 20 are then exposed to a plasma containing $CF_4$ and $H_2O$, indicated by arrows 22. Exposure to the plasma containing $CF_4$ and $H_2O$ enables rapid stripping of photoresist mask 13 and rapid removal of polymeric residues 23 from via opening 20, as shown in FIG. 3. Adverting to FIG. 4, the interconnection is completed by filling via opening 20 with conductive material 40, e.g., copper, with an initial barrier layer such as tantalum, and forming an overlying metal feature 41 in electrical contact with underlying metal feature 11.

Figure 5:
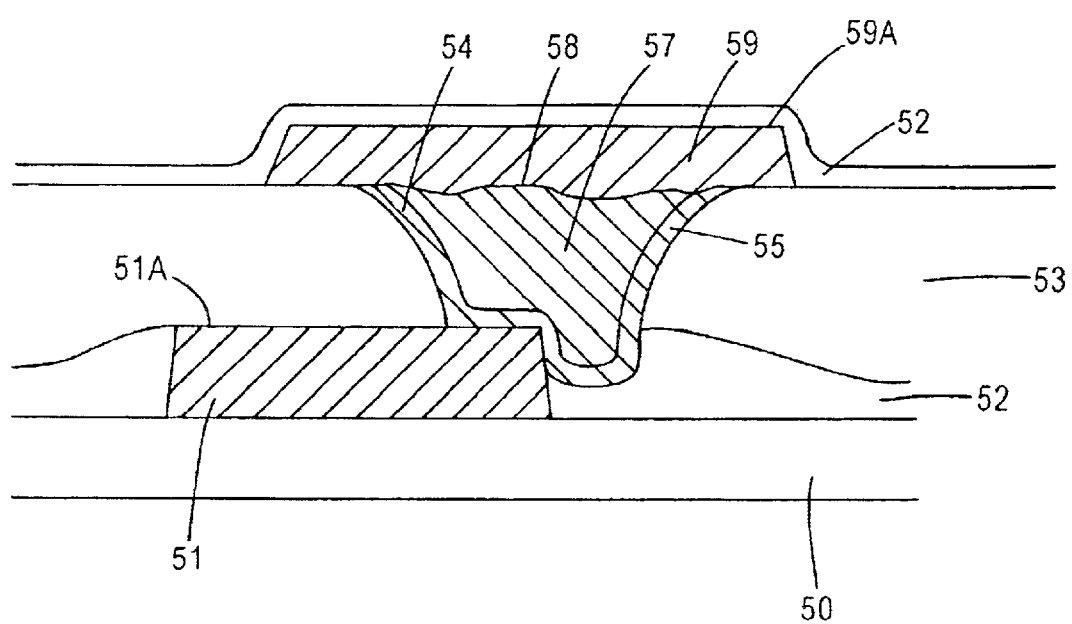
FIG. 5 schematically illustrates a borderless via formed according to an embodiment of the present invention.

The formation of a borderless via in accordance with another embodiment of the present invention is schematically illustrated in FIG. 5, wherein metal feature 51 of a patterned metal layer is formed on dielectric layer 50, with anti-reflective coating 51A thereon. Gaps between metal features are filled with a low-k material 52, such as HSQ. An ILD 53, which can be another low-k material or an oxide derived from TEOS (tetraethyl orthosilicate) or silane by plasma enhanced chemical vapor deposition (PECVD), is then deposited and then planarized, as by CMP. A photoresist mask (not shown) is formed thereon. Anisotropic etching is then conducted to form misaligned through-hole 54 penetrating HSQ layer 52 and exposing a portion of a side surface of metal feature 51. After formation of through-hole 54, the photoresist mask employed is stripped at a rate of about 15 KÅ/min. and polymeric residues removed employing a plasma containing $CF_4$ and $H_2O$ while preventing reduction in the number of Si—H bonds of the as-deposited HSQ gap fill layer 52 below about 70% and preventing degradation of low-k ILD 53. Degradation of the as-deposited HSQ layer which typically occurs upon $O_2$-plasma stripping of a photoresist layer and solvent cleaning is avoided or substantially prevented by employing a plasma containing $CF_4$ and $H_2O$ for photoresist mask stripping and polymeric residue removal. Accordingly, the formation of a significant number of Si—OH bonds along with an undesirable propensity to absorb moisture are prevented. As a result, the present invention advantageously prevents the generation of voids by outgassing upon filling the through-hole with conductive material, yielding a highly reliable interconnect pattern.

Through-hole 54 is then filled with a composite plug, as by initially depositing a barrier layer 55 which serves as an adhesion promoter for metal 57. When employing copper as the metal 57, a barrier layer such as tantalum or tantalum nitride is employed. When employing tungsten as metal 57, the barrier layer is typically a refractory metal, such as titanium, titanium-nitride, titanium-tungsten or titanium—titanium nitride.

After forming conductive via 58, a second patterned metal layer is formed on second dielectric layer 53 and comprises metal feature 59, with anti-reflective coating 59A thereon, electrically connected to metal feature 51 through conductive via 58. The methodology is then repeated by gap filling the second patterned metal layer employing HSQ and substantially repeating the plasma exposure step in forming misaligned through-holes for borderless vias by employing a plasma containing $CF_4$ and $H_2O$ for rapid photoresist mask stripping and polymeric residue removal to avoid undesirable reduction in the number of Si—H bonds of the as-deposited HSQ gap fill layers until a desired number of patterned metal layers are formed and gap filled, e.g., five metal layers.

In implementing the embodiments of the present invention, the optimum plasma conditions can be determined in a particular situation depending upon the particular tool employed. For example, it was found suitable to employ a plasma containing $CF_4$ and $H_2O$ for photoresist stripping at a rate of about 10,000 to about 20,000 Å/min. at a temperature of about 190° C. to about 290° C., RF power of about 800W to about 1,200W, pressure of about 960 to about 1,440 mTorr, a water vapor flow rate of about 240 to about 360 sccm, and a $CF_4$ flow rate of about 30 to about 60 SCCM, thereby enabling rapid photoresist mask removal in about 20 seconds to about 60 seconds, such that HSQ exhibited no less than about 70% of the as-deposited Si—H bonds.

EXAMPLE

Experimentation was conducted to illustrate the advantages of the present invention employing a water vapor plasma vis-a-vis a conventional $O_2$ plasma. The results are illustrated in Table I below.

| Condition | strip rate | k | relative Si—H % with respect to as deposited HSQ (from FTIR) |
|---|---|---|---|
| Unprocessed HSQ | n/a | 2.9–3.0 | 100% |
| 02 plasma, 2 min, 240° C. | 30–40K Å/min. | 4–8 | 23% |
| Solvent clean | n/a | 15–70 | <10% |
| $H_2O/CF_4$ plasma, 100° C. | 15K Å/min. | 3.1–3.2 | 65–70% |

Suitable process parameters for the plasma employed in Table I include an inductively coupled plasma at a temperature of about 100° C. to about 240° C., 100W RF power, a pressure of about 1,200 mTorr, a water vapor flow rate of about 300 sccm, and a $CF_4$ flow rate of about 30 to about 60 sccm. It should be apparent from Table I that a plasma containing $CF_4$ and $H_2O$ enables rapid removal of the photoresist mask without degradation of the HSQ ILD.

The present invention is applicable to the production of various types of semiconductive devices, particularly high density multi-metal patterned layers with submicron features having a design rule of about 0.15 micron and below, e.g., about 0.12 micron and below, exhibiting high speed characteristics and improved reliability. The present invention enables the advantageous use of low-k materials, such as HSQ, for ILDs and gap filling in forming interconnection patterns without the adverse consequences of process induced degradation, as from exposure to an $O_2$-containing plasma and solvent cleaning anisotropically etched openings and without adversely impacting manufacturing throughput. The present invention is cost effective and can easily be integrated into conventional processing and equipment.

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, the method comprising:

forming a first dielectric layer on a substrate;

forming a first patterned conductive layer having gaps on the first dielectric layer, the first patterned conductive layer comprising a first conductive feature having an upper surface and side surfaces;

depositing a dielectric gap fill layer so fill the gaps;

depositing a second dielectric layer on the first patterned conductive layer and on the gap fill layer, wherein the as-deposited gap fill layer and/or second dielectric layer have a dielectric constant no greater than about 3;

forming a photoresist mask on the second dielectric layer;

forming a through-hole in the second dielectric layer exposing the upper surface of the first conductive feature; and removing the photoresist mask and cleaning the through-hole with a plasma containing carbon tetrafluoride ($CF_4$) and water vapor ($H_2O$) such that the dielectric constant of the as deposited gap fill layer and/or the second dielectric layer does not increase more than about 15%.

2. The method according to claim 1, wherein the gap fill layer and/or the second dielectric layer have an as-deposited dielectric constant of about 1.8 to about 3.

3. The method according to claim 1, wherein the gap fill layer and/or the second dielectric layer comprise hydrogen silsesquioxane (HSQ).

4. The method according to claim 1, comprising removing the photoresist mask and cleaning the through-hole such that the dielectric constant of the gap fill layer and/or second dielectric layer does not increase more than about 10%.

5. The method according to claim 3, comprising removing the photoresist mask and cleaning the through-hole such that the number of Si—H bonds in the as-deposited HSQ gap fill layer and/or second dielectric layer is not reduced below about 60% to about 80%.

6. The method according to claim 5, comprising removing the photoresist mask and cleaning the through-hole such that the number of Si—H bonds in the HSQ gap fill layer or second dielectric layer is not reduced below about 70% of the Si—H bonds in the as-deposited HSQ gap fill or second dielectric layer.

7. The method according to claim 6, wherein the HSQ gap fill layer and/or second dielectric layer have a dielectric constant of about 3.1 to about 3.3 after removing the photoresist mask and cleaning the through-hole.

8. The method according to claim 1, comprising removing the photoresist mask at a rate of about 10 to about 20K Å/min.

9. The method according to claim 8, comprising removing the photoresist mask and cleaning the through-hole at a:

temperature of about 190° C. to about 200° C.;

RF power of about 800W to about 1,200W;

pressure of about 960 to about 1,440 mTorr;

an $H_2O$ flow rate of about 240 to about 360 sccm; and a $CF_4$ flow rate of about 30 to about 60 sccm.

10. The method according to claim 9, comprising removing the photoresist mask for about 20 to about 60 seconds.

11. The method according to claim 1, comprising forming the through-hole in the second dielectric layer exposing a portion of the upper surface and at least a portion of a side surface of the first conductive feature and penetrating into and exposing a portion of the gap fill layer.

12. The method according to claim 11, comprising filling the through-hole with conductive material to form a borderless via.

13. A method of manufacturing a semiconductor device, the method comprising:

depositing a layer of dielectric material, having an as-deposited dielectric constant no greater than about 3, over a conductive region or conductive feature;

forming a photoresist mask on the layer of dielectric material;

forming a through-hole in the dielectric layer exposing the upper surface of the conductive region or conductive feature; and removing the photoresist mask and cleaning the through-hole with a plasma containing carbon tetrafluoride ($CF_4$) and water vapor ($H_2O$) such that the dielectric constant of the dielectric layer does not increase more than about 15%.

14. The method according to claim 13, wherein the dielectric material comprises hydrogen silsesquioxane (HSQ).

15. The method according to claim 14, comprising removing the photoresist mask and cleaning the through-hole such that the number of Si—H bonds in the as-deposited HSQ dielectric layer is not reduced below about 70%.

16. The method according to claim 15, wherein the HSQ dielectric layer has a dielectric constant of about 3.1 to about 3.3 after removing the photoresist mask and cleaning the through-hole.

17. The method according to claim 13, comprising removing the photoresist mask as a rate of about 10 to about 20KÅ/min.

18. The method according to claim 17, comprising removing the photoresist mask with a water vapor plasma:

at a temperature of about 190° C. to about 290° C.;

at an RF power of about 800W to about 1,200W;

at a pressure of about 960 to about 1,440 mTorr;

at an $H_2O$ flow rate of about 240 to about 360 sccm; and at a $CF_4$ flow rate of about 30 to about 60 sccm; for about 20 to about 60 seconds.

* * * * *